(12) United States Patent
Sullivan et al.

(10) Patent No.: US 8,207,725 B2
(45) Date of Patent: *Jun. 26, 2012

(54) TESTER HAVING DEVICE UNDER TEST POWER SUPPLY

(75) Inventors: Patrick Sullivan, San Diego, CA (US);
Steven R. Bristow, San Jose, CA (US);
William R. Creek, San Diego, CA (US);
Jeffrey Allen King, San Francisco, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/211,077

(22) Filed: Aug. 16, 2011
(Under 37 CFR 1.47)

(65) Prior Publication Data

US 2011/0298483 A1    Dec. 8, 2011

Related U.S. Application Data

(63) Continuation of application No. 12/408,157, filed on Mar. 20, 2009, now Pat. No. 7,999,530.

(60) Provisional application No. 61/038,691, filed on Mar. 21, 2008.

(51) Int. Cl.
*H02M 3/156* (2006.01)
*G01R 31/40* (2006.01)

(52) U.S. Cl. ............ 323/351; 324/754.03; 324/754.07; 324/756.03; 324/764.01; 324/434

(58) Field of Classification Search ................ 323/282, 323/318, 349–351; 324/426, 434, 750.01–764.01; 702/60–65

See application file for complete search history.

(56) References Cited

U.S. PATENT DOCUMENTS

| | | | |
|---|---|---|---|
| 4,158,803 | A | 6/1979 | Berger |
| 4,707,620 | A | 11/1987 | Sullivan et al. |
| 5,107,230 | A | 4/1992 | King |
| 5,220,208 | A | 6/1993 | Schenck |
| 5,621,335 | A | 4/1997 | Andresen |
| 5,955,890 | A | 9/1999 | Gillette |
| 6,445,245 | B1 | 9/2002 | Schultz et al. |

(Continued)

OTHER PUBLICATIONS

Maxim Integrated Products, Dual Temperature-Controlled Resistors with Three Monitors, Dallas Semiconductor Maxim, DS1858, pp. 1-22 (2003) (Rev. 1; May 2006).

(Continued)

*Primary Examiner* — Adolf Berhane
*Assistant Examiner* — Jeffrey Gblende
(74) *Attorney, Agent, or Firm* — Dicke, Billig & Czaja, PLLC

(57) ABSTRACT

A tester includes a device under test (DUT) power supply (DPS) with and input and output includes an amplifier configured to set an output voltage of the DPS output equal to an input voltage for the DPS. The DPS has a first output stage coupled to the amplifier and configured to source and sink current at the output of the DPS between a first voltage rail and a third voltage rail. The DPS has a second output stage coupled to the amplifier and configured to source and sink current to the output of the DPS between a second voltage rail and the third voltage rail. A selection device is configured to enable the first and second output stages based on a selection input signal. The selection device is situated outside of the first and the second output stages.

20 Claims, 4 Drawing Sheets

U.S. PATENT DOCUMENTS

| | | | |
|---|---|---|---|
| 6,456,103 | B1 | 9/2002 | Eldridge et al. |
| 6,489,837 | B2 | 12/2002 | Schultz et al. |
| 6,496,028 | B1 | 12/2002 | Manhaeve et al. |
| 6,504,395 | B1 | 1/2003 | Johnson |
| 6,756,807 | B2 * | 6/2004 | Johnson et al. ............... 323/265 |
| 6,933,746 | B1 | 8/2005 | Creek |
| 7,236,905 | B2 * | 6/2007 | Kodera ......................... 702/124 |
| 7,436,200 | B1 * | 10/2008 | Jacobsen et al. ......... 324/764.01 |
| 7,675,310 | B2 | 3/2010 | Sullivan |
| 2003/0080771 | A1 * | 5/2003 | Johnson ........................ 324/771 |
| 2005/0285613 | A1 * | 12/2005 | Isakharov et al. ............. 324/765 |

OTHER PUBLICATIONS

Office Action for U.S. Appl. No. 11/584,840 mailed Mar. 19, 2009 (8 pages).

Office Action for U.S. Appl. No. 11/584,840 mailed Sep. 29, 2008 (9 pages).

Notice of Allowance for U.S. Appl. No. 12/408,157 mailed Apr. 4, 2011 (16 pages).

* cited by examiner

TESTER HAVING DEVICE UNDER TEST POWER SUPPLY

CROSS-REFERENCE TO RELATED APPLICATIONS

This application is a continuation of U.S. application Ser. No. 12/408,157, filed Mar. 20, 2009, which claims priority under 35 U.S.C. §119(e) to U.S. Provisional Patent Application Ser. No. 61/038,691 entitled "POWER SUPPLY CIRCUIT," having a filing date of Mar. 21, 2008, and which are incorporated herein by reference.

BACKGROUND

A device under test (DUT) power supply (DPS) is typically employed to provide a constant output voltage for testing integrated circuits. The DPS should provide an accurate output voltage while sourcing and/or sinking a wide range of currents to the DUT. In addition, the DPS should respond quickly to transient currents without compromising the accuracy of the output voltage. Further, the DPS should be able to drive a wide range of capacitive loads and remain stable, while minimizing power dissipation in the DPS. For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated, as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that features of the various exemplary embodiments described herein may be combined with each other, unless specifically noted otherwise.

Figure 1:
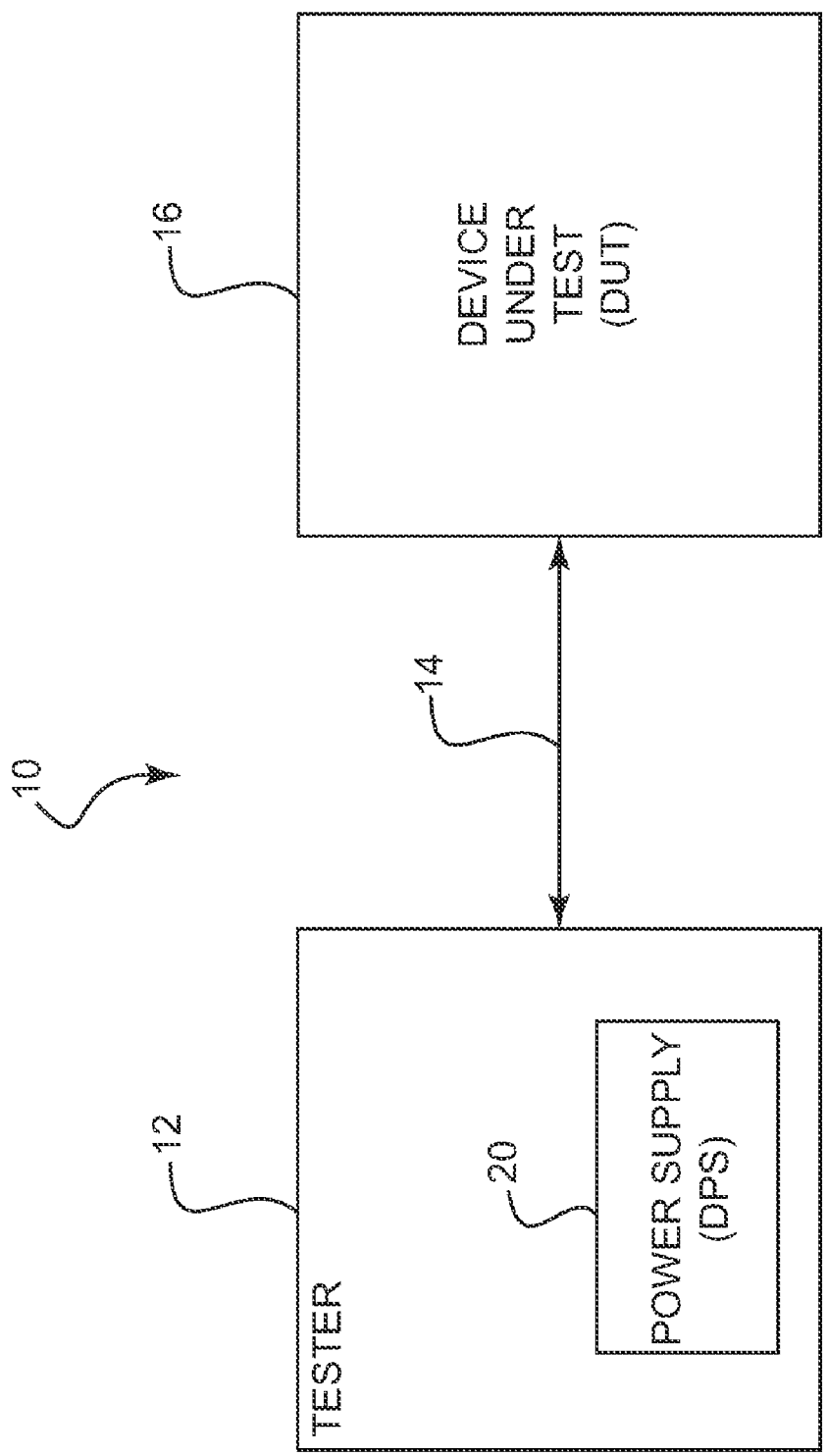
FIG. 1 is a block diagram illustrating one embodiment of a test system.

FIG. 1 is a block diagram illustrating one embodiment of a test system 10. Test system 10 includes tester 12 and a device under test (DUT) 16. Tester 12 includes a DUT power supply (DPS) 20. Tester 12 is electrically coupled to DUT 16 through communications path 14. Tester 12 tests DUT 16 through communications path 14. DUT 16 can be any suitable integrated circuit, such as a processor or memory.

In one example, DUT 16 is a device manufactured during a production process. In one example, DUT 16 is an integrated circuit. After its production in certain circumstances, a manufacturer may want to test the device or integrated circuit in order to determine its operability and performance. Tester 12 can be coupled with and employed to test DUT 16.

In one embodiment, DPS 20 is used as a device under test (DUT) power supply (DPS), as part of test system 10. More specifically, the output of DPS 20 can be connected via communications path 14 to a power supply pin of a device under test (DUT) 16. DPS 20 supplies a constant output voltage to DUT 16 based on a forcing voltage input while supplying a variable current (sourcing and/or sinking) to DUT 16. When DPS 20 is sourcing current, DUT 16 is sinking current and current flows in the direction toward DUT 16. When DPS 20 is sinking current, DUT 16 is sourcing current and current flows in the direction away from DUT 16.

Figure 2:
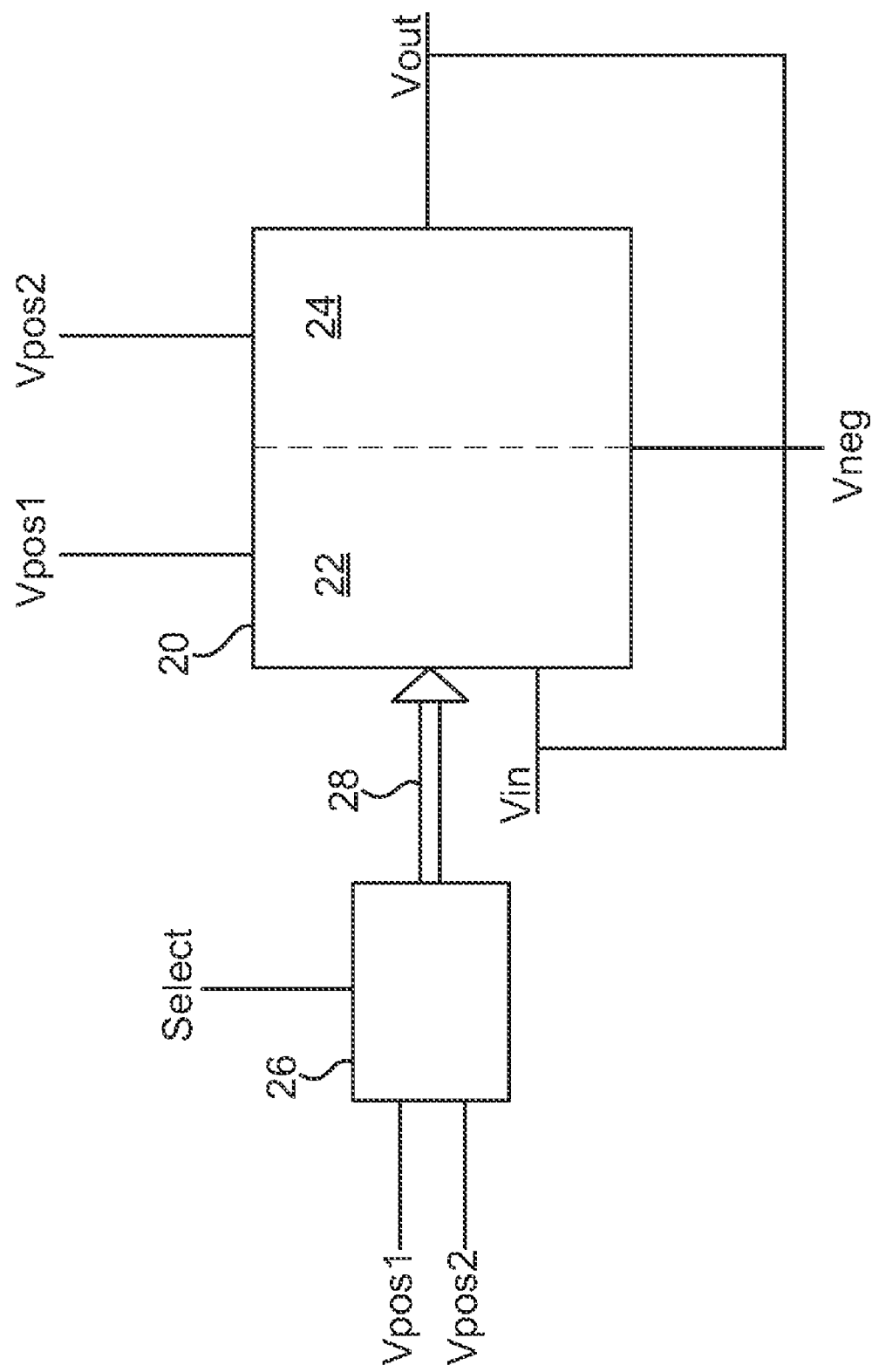
FIG. 2 is a block diagram illustrating one embodiment of a device under test (DUT) power supply (DPS).

FIG. 2 illustrates power supply circuit 20 in accordance with one embodiment. In one example, power supply circuit 20 includes a first output stage 22 and a second output stage 24, illustrated as generally separated by a vertical dashed line. Power supply circuit 20 also has three voltage supply rails, including first positive voltage rail Vpos1, second positive voltage rail Vpos2 and negative voltage rail Vneg. Power supply circuit includes an input terminal Vin and an output terminal Vout. Selection device 26 is also coupled to power supply circuit 20 and is provided with first and second positive voltage rails Vpos1 and Vpos2 and with a select signal. Based on the select signal, either first positive voltage rail Vpos1 or second positive voltage rail Vpos2 is provided to power supply circuit 20 via selected power line 28.

In operation of one embodiment, first and second voltage supply rails Vpos1 and Vpos2 are high voltage supply rails, and negative voltage supply rail Vneg is a low voltage supply rail. In one example, first voltage supply rail Vpos1 is at a higher voltage than second voltage supply rail Vpos2. While the voltage of the negative voltage supply rail Vneg may be at a negative voltage, it may alternatively be at ground, or it may be at a positive voltage that is less than the voltage at second voltage supply rail Vpos2. Power supply circuit 20 produces an output voltage Vout equal to the input voltage Vin, that is, Vout=Vin, and produces an output current.

In operation, a selection is made to enable first and second output stages 22 and 24 based on an application of DUT 16. When selected, first output stage 22 drives the output Vout between first positive voltage rail Vpos1 and negative voltage rail Vneg. When selected, second output stage 24 drives the output Vout between second positive voltage rail Vpos2 and negative voltage rail Vneg. Where first and second positive voltage rails Vpos1 and Vpos2 are at different voltages, the two output stages provide two different voltage ranges for supplying power to DUT 16.

In one embodiment, the selection of an output stage is accomplished with a select signal that is provided to selection device 26. Based on the select signal, either first positive voltage rail Vpos1 or second positive voltage rail Vpos2 is provided to power supply circuit 20 via selected power line 28. The provision of first positive voltage rail Vpos1 or second positive voltage rail Vpos2 to power supply circuit 20 at selected power line 28 effectively enables first output stage 22 or second output stage 24. When first positive voltage rail Vpos1 is provided via selected power line 28, first output stage 22 is enabled, and the output Vout is driven between first positive voltage rail Vpos1 and negative voltage rail Vneg. When second positive voltage rail Vpos2 is provided via selected power line 28, second output stage 24 is enabled, and the output Vout is driven between second positive voltage rail Vpos2 and negative voltage rail Vneg.

In each case, Vout is driven by one of the output stages between two voltage rails, and selection device 26 is not in series between the voltage rails.

As such, there is no power dissipation over selection device 26 between the voltage rails. This embodiment provides a flexible power supply circuit 20, allowing selection between different output stages, yet also provides an efficient power supply circuit 20 without dissipation loss due to the selection device.

In one embodiment, power supply circuit 20 is flexible power supply that provides good sourcing for a device under test (such as DUT 16 in FIG. 1) under multiple applications. For example, in one case power supply circuit 20 can provide a higher voltage, such as 13 volt supply on first positive voltage rail Vpos1, with relatively low current. Then, in another application it can also provide lower voltage, such as 3 volt supply on second positive voltage rail Vpos2, with relatively high current. In either case, there is very little power dissipation so that power supply 20 is efficient. For example, there is no power dissipation over selection device 26, which effectuates the switching between first and second output stages 22 and 24, and thus, between first and second positive voltage rails Vpos1 and Vpos2.

Figure 3:
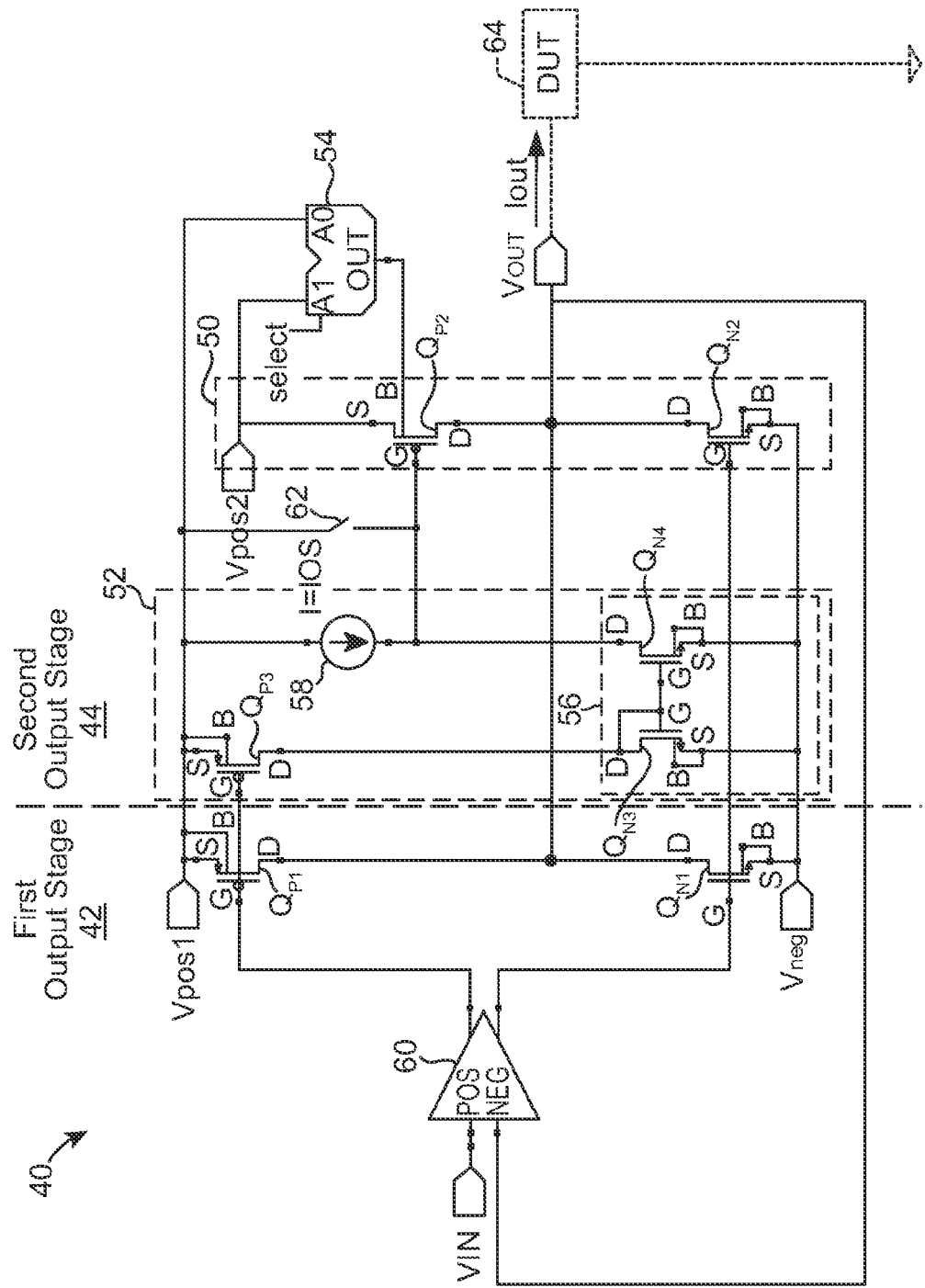
FIG. 3 is a schematic diagram illustrating one embodiment of a device under test (DUT) power supply (DPS).

FIG. 3 illustrates power supply circuit 40 in accordance with one embodiment. In one example, power supply circuit 40 includes a first output stage 42 and a second output stage 44, illustrated as generally separated by a vertical dashed line. Power supply circuit 40 also has three voltage supply rails, including first positive voltage rail Vpos1, second positive voltage rail Vpos2 and negative voltage rail Vneg. Power supply circuit includes an input terminal Vin and an output terminal Vout and an operational amplifier 60.

In operation of one embodiment, first and second voltage supply rails Vpos1 and Vpos2 are high voltage supply rails, and negative voltage supply rail Vneg is a low voltage supply rail. In one example, first voltage supply rail Vpos1 is at a higher voltage than second voltage supply rail Vpos2. While the voltage of the negative voltage supply rail Vneg may be at a negative voltage, it may alternatively be at ground, or it may be at a positive voltage that is less than the voltage at second voltage supply rail Vpos2. Power supply circuit 40 produces an output voltage Vout equal to the input voltage Vin, that is, Vout=Vin, and produces an output current (Iout).

First output stage 42 includes transistors QP1 and QN1 coupled between voltage supply rails Vpos1 and Vneg. Each of transistors QP1 and QN1 include gate (G), drain (D), source (S), and body (B) terminals. In one embodiment, the drain (D) terminals of QP1 and QN1 are coupled together and to the output terminal Vout. The source (S) terminals of QP1 and QN1 are respectively coupled to first positive voltage rail Vpos1 and negative voltage rail Vneg. Gate (G) terminals of QP1 and QN1 are coupled to the positive and negative output terminals of operational amplifier 60. Body (B) terminals of QP1 and QN1 are coupled to the respective source (S) terminals. In one embodiment, first output stage 42 is configured as a low current output stage.

Second output stage 44 includes second output stage portion 50, gate drive circuit 52 and multiplexor 54. In one example, second output stage portion 50 includes transistors QP2 and QN2 coupled between second voltage supply rail Vpos2 and negative voltage rail Vneg. Each of transistors QP2 and QN2 include gate (G), drain (D), source (S), and body (B) terminals. In one embodiment, the drain (D) terminals of QP2 and QN2 are coupled together and to the output terminal Vout. The source (S) terminals of QP2 and QN2 are respectively coupled to second positive voltage rail Vpos2 and negative voltage supply rail Vneg. The gate (G) terminal of QN2 is coupled to the negative output terminal of operational amplifier 60. The gate (G) terminal of QP2 is coupled to gate drive circuit 52. The body (B) terminal of QN2 is coupled to its source (S) terminals, and the body (B) terminal of QP2 is coupled to an output of multiplexor 54.

Gate drive circuit 52 includes current mirror 56, transistor QP3 and current source 58. Current mirror 56 includes transistors QN3 and QN4. Each of transistors QP3, QN3 and QN4 include gate (G), drain (D), source (S), and body (B) terminals. In one embodiment, the drain (D) terminals of QP3 and QN3 are coupled together. The source (S) terminals of QP3 and QN3 are respectively coupled to first positive voltage rail Vpos1 and negative voltage rail Vneg. The body (B) terminals of QP3 and QN3 are coupled to their respective source (S) terminals. The gate (G) terminal of QN3 is coupled to the gate (G) terminal of QN4, and the gate (G) terminal of QP3 is coupled to the positive output terminal of operational amplifier 60. The source (S) and body (B) terminals QN4 are coupled to the negative voltage rail Vneg and the drain (D) terminal is couple to current source 58, which is turn is coupled to first positive voltage rail Vpos1. In one example, gate driver circuit 52 is responsive to the output of operational amplifier 60 and drives the second output stage portion 50 of second output stage 44.

Multiplexor 54 includes a selection input configured to receive a select signal, and has a first input (A0) configured to receive first voltage at first positive voltage rail Vpos1 and has a second input (A1) configured to receive the second voltage at second positive voltage rail Vpos2. In operation, multiplexor 54 outputs one of these first or second voltages at its output (OUT) based on the select signal.

In operation of one embodiment, second output stage 44 is configured as a high current output stage that operates over a smaller voltage range relative to first output stage 42. In one example, power supply circuit 40 operates between the voltage at second positive voltage rail Vpos2 and the voltage at negative voltage rail Vneg. However, it is also able to be driven beyond the voltage at second positive voltage rail Vpos2 when the second output stage 44 is not being used (that is, not sourcing current).

In one embodiment, gate drive circuit 52 produces a buffered version of the signal provided to the gate of transistor QP1 by operation amplifier 60, and thus, gate drive circuit 52 can be referred to as a buffer. Gate drive circuit 52 introduces an offset, so that transistor QP2 turns on after transistor QP1. Gate drive circuit 52 can also provide a gain such that once transistor QP2 is turned on the gate of transistor QP2 will be pulled down at a faster rate (for example, DV(Qp2)/DV (Vpos-Vneg)), than the gate of transistor QP1. While current mirror 56 is illustrated as a simple current mirror including transistors QN3 and QN4, alternative current mirrors can be used in other embodiments. Current source 58 produces a current I=IOS.

In one embodiment, operational amplifier 60 provides gain and level shifting to drive first and second output stages 42 and 44 such that VIN=VOUT. If VOUT falls below VIN, the top output of operational amplifier 60 will pull down on the gate of transistors QP1 and QP3, and ultimately transistor QP2, so that the transistors can source more current to pull the output VOUT up until VIN=VOUT. Simultaneously, the bottom output of operational amplifier 60 will pull down on the gates of transistors QN1 and QN2 such that they sink less current, allowing the output VOUT to be pulled up. The two outputs of operational amplifier 60 move in the same direction, but have slightly different gains and have different offsets. The top output is referenced to the voltage at first positive voltage rail Vpos1, while the bottom output is referenced to the voltage at negative voltage rail Vneg.

In operation of one embodiment, output (VOUT) of power supply circuit 40 is provided at the drains (D) of transistors QP1, QP2, QN1 and QN2. The drains (D) of QP1 and QN1 are the output of first output stage 42 and the drains (D) of QP2 and QN2 are the output of second output stage 44. In accordance with an embodiment, transistor QP2 is considerably larger than transistor QP1, thereby allowing second output stage 44 to source larger amounts of current than first output stage 42.

In one embodiment, power supply circuit 40 is flexible power supply that provides good sourcing for a device under test (such as DUT 64) under multiple applications. For example, in one case power supply circuit 40 can provide a higher voltage, such as 13 volt supply on first positive voltage rail Vpos1, with relatively low current. Then, in another application it can also provide lower voltage, such as 3 volt supply on second positive voltage rail Vpos2, with relatively high current. In either case, there is very little power dissipation so that power supply 40 is efficient. For example, there is no power dissipation over a switch or other selection device attributable to switching between first and second output stages 42 and 44 or between first and second positive voltage rails Vpos1 and Vpos2.

In operation, a selection is made between first and second output stages 42 and 44 based on an application of DUT 64. In one embodiment, a register or bit can be set to make the selection. That selection is then transmitted to multiplexor 54 as the select signal, which toggles the output between A0 and A1 as discussed above.

As such, the combined first and second output stages 42 and 44 operate under two static conditions, based on the state of multiplexor 54. In accordance with one embodiment, where multiplexor 54 is set to A1, the output (OUT) of multiplexor 54 is the voltage at second positive voltage rail Vpos2, for example, 3 volts. In one embodiment where there is a need to drive VIN=VOUT greater than that voltage at second positive voltage rail Vpos2, then the select bit is set such that A0 is selected. In that case, the output (OUT) of multiplexor 54 is the voltage at first positive voltage rail Vpos1, for example, 13 volts.

In operation, the output (OUT) of multiplexor 54 is tied to the body (B) of transistor QP2. When A0 is selected, first positive voltage rail Vpos1 is coupled to the body (B) of QP2. In this condition, the sourced output current is limited to the maximum drain current of transistor QP1 (IDmax$_1$), where IDmax$_1$=K*W/L*(VGS-Vthreshold)^2, where K is a constant, W is the channel width, and L is the channel length.

If there is a need to source a larger current than the drain current of transistor QP1 (IDmax$_1$), then the select bit is set such that A1 is selected and the voltage at second positive voltage rail Vpos2 is coupled to the body (B) of QP2. Under this condition, VIN=OUT is less than the voltage at second positive voltage rail Vpos2.

In a first static conditional, a control signal provided to the select input of multiplexor 54 causes it to output the voltage at first positive voltage rail Vpos1. As illustrated in FIG. 3, during this condition (that is, the first static condition) the body of transistor QP2 is shorted to the voltage at first positive voltage rail Vpos1. There are four dynamic conditions that can occur during this first static condition, and they can be identified by the state of the output current Iout. In a first dynamic condition output current Iout is zero, in a second dynamic condition output current Iout is sinking current, in a third dynamic condition output current Iout is sourcing a small amount of current, and in a fourth dynamic condition output current Iout is sourcing a large amount of current.

Similarly, in a second static condition, a control signal provided to the select input of multiplexor 54 causes it to output the voltage at second positive voltage rail Vpos2. As illustrated in FIG. 3, during this condition (that is, the second static condition) the body of transistor QP2 is shorted to the voltage at second voltage supply rail Vpos2. There are four dynamic conditions that can occur during this second static condition, and they are defined the same way as were the dynamic conditions above with respect to the first static condition.

In operation during the first static condition (that is, when the body (B) of transistor QP2 is shorted to the voltage at first positive voltage rail Vpos1), the first dynamic condition occurs when the output current Tout is zero. Under this quiescent operating condition, a drain current flows in transistor QP1 that is equal to the drain currents in transistors QN1 and QN2. A current flows in the drain (D) of transistor QP3 that is mirrored by current mirror 56 (which includes transistors QN3 and QN4) into the gate of transistor QP2. The static current IOS is set to exceed the mirrored drain current of transistor QP3 such that the gate voltage (VG) of transistor QP2 is at or near the voltage at first positive voltage rail Vpos1. Since the gate source voltage (VGS) of transistor QP2 is less than Vthreshold of transistor QP2, transistor QP2 will be off A small change in the input/output voltage will cause a corresponding change in the gate voltages of transistors QP1 and QN1 such that the output voltage and input voltage match, that is, VIN=VOUT. The common mode voltage range is the voltage at first positive voltage rail Vpos1 to the voltage at negative voltage rail Vneg.

During the first static condition, the second dynamic condition occurs when the output current Tout is sinking current. When power supply 40 is sinking current, the gate voltages of transistors QN1 and QN2 rise to increase the drain currents sufficient to sink the additional current and maintain the output voltage VOUT=VIN. The common mode voltage range is the voltage at first positive voltage rail Vpos1 to the voltage at negative voltage rail Vneg. During the first static condition, the third dynamic condition occurs when the output current Tout is sourcing small currents. When power supply 40 must source small amounts of current (that is, smaller than IDmax$_1$), the gate voltages of transistors QP1 and QP3 are lowered increasing their drain currents. In this case, the increased drain current of transistor QP1 is sufficient to source the additional output current and keep the output voltage VOUT=VIN. While the drain current of transistor QP3 and the current mirror 56 current in transistor QN4 increase in this condition, they do not exceed the current IOS, so transistor QP2 is still off In this condition it is possible for the output voltage VOUT to exceed the voltage at second positive voltage rail Vpos2, because the body of transistor QP2 is tied to the voltage at first positive voltage rail Vpos1, so the parasitic drain-body diode of transistor QP2 is not forward biased. The common mode voltage range is the voltage at first positive voltage rail Vpos1 to the voltage at negative voltage rail Vneg.

During the first static condition, the fourth dynamic condition occurs when the output current Tout is sourcing large currents. Power supply circuit 40 can be used to power a DUT, such as DUT 64. If the DUT exceeds the low current limit of first output stage 42, the drain current from transistor QP3 mirrored through transistor QN4 into the gate of transistor QP2 will be sufficient to overcome the static offset current IOS. When the gate of transistor QP2 falls below Vpos2-Vthreshold and the voltage OUT is below the voltage at second positive voltage rail Vpos2, then transistor QP2 will begin to conduct. In this case the power supply circuit 40 can source additional current, but the common mode voltage range is between the voltage at second positive voltage rail Vpos2 to the voltage at negative voltage rail Vneg. Because this may not be a desired state, a switch 62 can be used to keep transistor QP2 from turning on, in accordance with an embodiment. The switch 62 can be controlled in the same manner as multiplexor 54, that is, when output A0 of the multiplexor 54 is selected (during the first static condition), switch 62 can be closed so that the gate of transistor QP2 is shorted to the voltage at first positive voltage rail Vpos1. Because the gate source voltage (VGS) of transistor QP2<Vthreshold, this would cause transistor QP2 to always be off during the first static condition. As such, (with switch 62 closed), the common mode voltage range is the voltage at first positive voltage rail Vpos1 to the voltage at negative voltage rail Vneg.

In operation during the second static condition (that is, when the body (B) of transistor QP2 is shorted to the voltage at second positive voltage rail Vpos2), the first dynamic condition occurs when the output current Tout is zero. Under this quiescent operating condition, a drain current flows in transistor QP1 that is equal to the drain currents in transistors QN1 and QN2. A current flows in the drain (D) of transistor QP3 that is mirrored by current mirror 56 into the gate (G) of transistor QP2. The static current IOS is set to exceed the mirrored drain current of transistor QP3 such that the gate voltage (VG) of transistor QP2 is at or near the voltage at first positive voltage rail Vpos1. Since the gate source voltage (VGS) of transistor QP2 is less than Vthreshold of transistor QP2, transistor QP2 will be off A small change in the input/output voltage will cause a corresponding change in the gate voltages of transistors QP1 and QN1 such that the output voltage and input voltage match, that is, VIN=VOUT. The common mode voltage range is the voltage at second positive voltage rail Vpos2 to the voltage at negative voltage rail Vneg, because a parasitic drain-body diode exists between the drain (D) of transistor QP2 and second positive voltage rail Vpos2 (which is shorted to the body (B) of transistor QP2).

During the second static condition, the second dynamic condition occurs when the output current Tout is sinking current. When power supply 40 is sinking current, the gate voltages of transistors QN1 and QN2 rise to increase the drain currents sufficient to sink the additional current and maintain the output voltage VOUT=VIN. The common mode voltage range is the voltage at second positive voltage rail Vpos2 to the voltage at negative voltage rail Vneg, because parasitic drain-body diode exists between the drain (D) of transistor QP2 and second positive voltage rail Vpos2 (which is shorted to the body (B) of transistor QP2).

During the second static condition, the third dynamic condition occurs when the output current Tout is sourcing small currents. When power supply 40 must source small amounts of current, the gate voltages of transistors QP1 and QP3 are lowered increasing their drain currents. In this case the increased drain current of transistor QP1 is sufficient to source the additional output current and keep the output voltage VOUT=VIN. While the drain current of transistor QP3 and the current mirror 56 current in transistor QN4 increase in this condition they do not exceed the static current IOS, so transistor QP2 is still off. The common mode voltage range is the voltage at second positive voltage rail Vpos2 to the voltage at negative voltage rail Vneg, because parasitic drain-body diode exists between the drain (D) of transistor QP2 and second positive voltage rail Vpos2 (which is shorted to the body (B) of transistor QP2).

During the second static condition, the fourth dynamic condition occurs when the output current tout is sourcing large currents. If DUT 64 exceeds the low current limit of first output stage 42, the drain current from transistor QP3 mirrored through transistor QN4 into the gate of transistor QP2 will be sufficient to overcome the static offset current IOS. When the gate of transistor QP2 falls below the voltage at second positive voltage rail Vpos2 minus the Vthreshold of transistor QP2 and the output voltage VOUT is below the voltage at second positive voltage rail Vpos2, then transistor QP2 will begin to conduct. In this case, power supply circuit 40 can source large additional currents. The common mode voltage range is the voltage at second positive voltage rail Vpos2 to the voltage at negative voltage rail Vneg, because a parasitic drain-body diode exists between the drain of transistor QP2 and second positive voltage rail Vpos2, and because the drain source voltage (VDS) of transistor QP2 must be greater than 0V.

In some power supply circuits, there is only a single high voltage rail that needs to be greater than the largest positive output voltage OUT. In such conventional circuits, high current low voltage applications are not practical because the power dissipated, that is, Iout*(Vpos1-Vout), is prohibitive. By adding the second high voltage rail Vpos2, the power dissipation in power supply circuit 40 can be reduced by an amount =Iout*(Vpos1-Vpos2), making high current low voltage applications practical.

Figure 4:
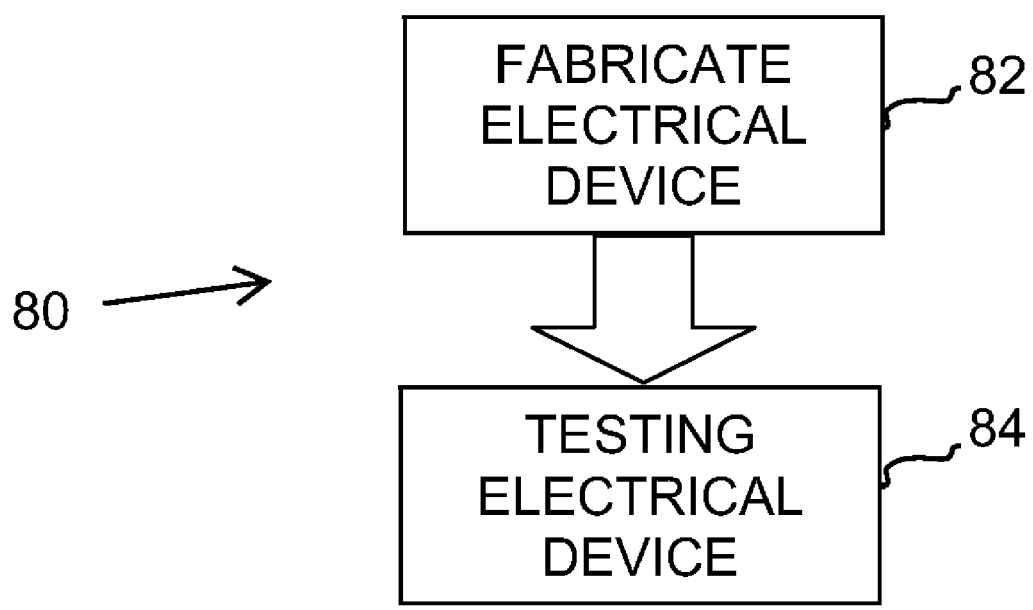
FIG. 4 is a flow chart illustrating a process for manufacturing an electrical device.

FIG. 4 is a flow chart illustrating a process 80 for manufacturing an electrical device. At 82, an electrical device is manufactured during a production process. After the production of the electrical device, the electrical device is tested at 84. In one embodiment, the testing of the electrical device includes the use of a power supply circuit, such as power supply circuit 20 or power supply circuit 40 as previously described herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A tester comprising:
    a device under test (DUT) power supply (DPS) with an input and an output, the DPS including:
        an amplifier configured to set an output voltage of the DPS output based on an input voltage for the DPS;
        a first output stage coupled to the amplifier and configured to source and sink current at the output of the DPS between a first voltage at a first voltage rail and a third voltage at a third voltage rail;

a second output stage coupled to the amplifier and configured to source and sink current to the output of the DPS between a second voltage at a second voltage rail and the third voltage at the third voltage rail; and a selection device configured to enable one of the first and second voltages based on a select input signal, wherein the selection device is situated outside of the first and the second output stages.

2. The tester of claim 1, wherein the selection device is not coupled in series between either the first and third voltage rails or the second and third voltage rails such that no power is dissipated over the selection device between either the first voltage rail and the third voltage rail or between the second voltage rail and the third voltage rail.

3. The tester of claim 1, wherein the first voltage at the first voltage rail is higher than the second voltage at the second voltage rail, and wherein the first and second voltages are both higher than the third voltage at the third voltage rail.

4. The tester of claim 1, wherein the amplifier comprises an operation amplifier having first and second inputs, and first and second outputs, the first input of the operational amplifier being the input of the DPS, and the second input of the operational amplifier connected to the output of the DPS circuit, wherein the input and output voltages of the DPS are substantially equal.

5. The tester of claim 1, wherein the second output stage comprises a gate drive circuit, the selection device and a second output stage portion.

6. The tester of claim 5, wherein the second output stage portion is coupled between the second voltage rail and the third voltage rail, and having an output connected to the output of the DPS circuit, and wherein one of the first output stage and the second output stage portion is enabled depending upon the output of the selection device.

7. The tester of claim 5, wherein the selection device comprises a multiplexer having first and second inputs and an output, the first input connected to the first voltage rail, the second input connected to the second voltage rail, and the output selectively providing one or the other of the first and second voltage rails.

8. The tester of claim 7, wherein each of the first output stage and the second output stage portion comprise two drain-connected transistors.

9. The tester of claim 8, wherein at least one of the transistors in the second output stage portion is significantly larger than one of the transistors in the first output stage.

10. The tester of claim 8, wherein the output of the multiplexor is coupled to a body terminal of one of the drain-connected transistors on the second output stage portion.

11. A tester comprising:
a device under test (DUT) power supply (DPS) with an input and an output, the DPS comprising:
means for setting an output voltage based on an input voltage for supplying to a DUT;
first means for sourcing and sinking current at the output of the DPS between a first voltage rail and a third voltage rail;
second means for sourcing and sinking current at the output of the DPS between a second voltage rail and the third voltage rail; and
means for enabling the first and second means based on a select input signal;
wherein the means for enabling is coupled such that no power is dissipated over it between either the first voltage rail and the third voltage rail or between the second voltage rail and the third voltage rail.

12. The tester of claim 11, wherein the means for enabling comprises a selection device that is situated outside the first and third voltage rails and outside the second and third voltage rails.

13. The tester of claim 12, wherein the selection device is not coupled in series between either the first and third voltage rails or the second and third voltage rails.

14. The tester of claim 11, wherein a first voltage at the first voltage rail is higher than a second voltage at the second voltage rail, and wherein the first and second voltages are both higher than a third voltage at the third voltage rail.

15. The tester of claim 11, wherein means for setting comprises an operation amplifier having first and second inputs, and first and second outputs, the first input of the operational amplifier being the input of the DPS, and the second input of the operational amplifier connected to the output of the DPS circuit.

16. A method performed in a tester for supplying power to a device under test (DUT), the method comprising:
setting an output voltage based on an input voltage for supplying to the DUT;
sourcing and sinking current at the output of the power supply between a first voltage rail and a third voltage rail with a first output stage;
sourcing and sinking current at the output of the power supply between a second voltage rail and the third voltage rail at a second output stage; and
enabling the first and second output stages via a selection device;
wherein the method is characterized by the absence of power dissipated over the selection device between either the first voltage rail and the third voltage rail or between the second voltage rail and the third voltage rail.

17. The method of claim 16, wherein enabling the first output stage provides sourcing and sinking current at the output of the power supply between the first voltage rail and the third voltage rail and disables sourcing and sinking current at the output of the power supply between the second voltage rail and the third voltage rail.

18. The method of claim 16, wherein enabling the second output stage provides sourcing and sinking current at the output of the power supply between the second voltage rail and the third voltage rail.

19. A tester comprising:
a device under test (DUT) power supply (DPS) with an input and an output, the DPS including a DPS circuit including:
an operation amplifier having first and second inputs, and first and second outputs, the first input of the op-amp being the input of the DPS circuit, and the second input of the op-amp connected to the output of the DPS circuit;
a first output stage driven by the first and second outputs of the op-amp, connected between a first high voltage rail and a low voltage rail, and having an output connected to the output of the DPS circuit; and
a second output stage also driven by the first and second outputs of the op-amp, and including
a gate drive circuit;
a multiplexer having first and second inputs and an output, the first input connected to the first high voltage rail, the second input connected to a second high voltage rail that is lower than the first high voltage rail, and the output selectively providing a voltage equal to the voltage of either the first high voltage rail or the second high voltage rail; and a second output stage portion connected between the second high voltage rail and the low voltage rail, and having an output connected to the output of the DPS circuit, the second output stage portion being selectively enabled depending upon the output of the multiplexer.

20. The tester of claim 19, wherein the first output stage is a low current stage and the second output stage is a high current stage.

* * * * *